(12) United States Patent
Smith et al.

(10) Patent No.: US 7,678,268 B2
(45) Date of Patent: Mar. 16, 2010

(54) WASTEWATER TREATMENT SYSTEM

(75) Inventors: Duane R. Smith, Edgar, WI (US);
Michael Howdeshell, Ringle, WI (US);
Lori Marten, Stevens Point, WI (US);
John A. Meidl, Schofield, WI (US);
Thomas J. Vollstedt, Weston, WI (US);
Robert J. Wenta, Wisconsin Rapids, WI
(US); Todd Wingers, Denver, CO (US);
Joseph E. Zuback, Camarillo, CA (US)

(73) Assignee: Siemens Water Technologies Corp.,
Warrendale, PA (US)

( * ) Notice: Subject to any disclaimer, the term of this
patent is extended or adjusted under 35
U.S.C. 154(b) by 0 days.

(21) Appl. No.: 11/683,888

(22) Filed: Mar. 8, 2007

(65) Prior Publication Data
US 2007/0209999 A1      Sep. 13, 2007

Related U.S. Application Data

(60) Provisional application No. 60/780,142, filed on Mar. 8, 2006, provisional application No. 60/747,853, filed on May 22, 2006, provisional application No. 60/820,410, filed on Jul. 26, 2006.

(51) Int. Cl.
*C02F 1/42* (2006.01)
(52) U.S. Cl. .................................................. 210/189
(58) Field of Classification Search ......... 210/615–618, 210/189, 670–678, 761
See application file for complete search history.

(56) References Cited

U.S. PATENT DOCUMENTS

| 4,080,287 | A | * | 3/1978  | Conway et al. ............. 210/604 |
| 4,265,747 | A |   | 5/1981  | Copa et al. |
| 4,626,354 | A |   | 12/1986 | Hoffman et al. |
| 4,749,492 | A |   | 6/1988  | Berrigan, Jr. et al. |
| 4,778,598 | A |   | 10/1988 | Hoffman et al. |
| 4,810,386 | A |   | 3/1989  | Copa et al. |
| 4,857,198 | A | * | 8/1989  | Meidl .......................... 210/603 |
| 4,897,196 | A |   | 1/1990  | Copa et al. |
| 5,082,571 | A |   | 1/1992  | Beula et al. |
| 5,240,619 | A |   | 8/1993  | Copa et al. |
| 5,244,576 | A |   | 9/1993  | DeRoeck et al. |
| 5,268,104 | A |   | 12/1993 | Masoomain |
| 5,298,174 | A |   | 3/1994  | Momont et al. |
| 5,368,726 | A |   | 11/1994 | Masoomian |
| 5,486,292 | A |   | 1/1996  | Bair et al. |
| 5,532,401 | A | * | 7/1996  | Stevenson et al. ............. 558/95 |
| 5,641,413 | A |   | 6/1997  | Momont et al. |

(Continued)

FOREIGN PATENT DOCUMENTS

WO    2006010218    2/2006

OTHER PUBLICATIONS

Porter, A.J. and Hayden, N.J., Nonylphenol in the Environment: A Critical Review. 2004 www.emba.uvm.edu/~nhayden/npreview.pdf.*

(Continued)

*Primary Examiner*—Chester T Barry

(57) ABSTRACT

The invention is directed to a method and apparatus for treating wastewater. The wastewater treatment system includes a bioreactor including activated carbon and a first biological population. The wastewater treatment system may also include a membrane bioreactor and/or a wet oxidation unit.

37 Claims, 7 Drawing Sheets

U.S. PATENT DOCUMENTS

| | | |
|---|---|---|
| 5,885,422 A | 3/1999 | Kurukchi et al. |
| 5,891,346 A | 4/1999 | Huntley |
| 5,932,099 A | 8/1999 | Cote et al. |
| 6,110,385 A | 8/2000 | Copa et al. |
| 6,113,790 A * | 9/2000 | McNabb ............... 210/631 |
| 6,210,583 B1 | 4/2001 | Kurukchi et al. |
| 6,444,130 B1 | 9/2002 | Manganaro et al. |
| 7,172,701 B2 | 2/2007 | Gaid et al. |
| 2004/0176526 A1 * | 9/2004 | Shimo-Ohsako et al. .... 524/514 |

OTHER PUBLICATIONS

Kemi Nonylphenol data sheet at http://apps.kemi.se/flodessok/floden/kemamne_Eng/nonylfenol_eng.htm (undated).*

International Preliminary Report on Patentability dated Nov. 25, 2009 for International Application No. PCT/US07/05775.*

* cited by examiner

WASTEWATER TREATMENT SYSTEM

RELATED APPLICATIONS

This application claims priority under 35 U.S.C. §119(e) to the following U.S. Provisional Applications: U.S. Provisional Application Ser. No. 60/780,142, titled "TREATMENT OF ENDOCRINE DISRUPTING COMPOUNDS IN A PACT/WAR SYSTEM," filed on Mar. 8, 2006; U.S. Provisional Application Ser. No. 60/747,853 titled "METHOD AND APPARATUS FOR TREATING WASTEWATER," filed on May 22, 2006; and U.S. Provisional Application Ser. No. 60/820,410 titled "COMBINED MEMBRANE BIOREACTOR POWDERED ACTIVATED CARBON TREATMENT AND WET AIR REGENERATION SYSTEM FOR DIFFICULT TO TREAT WASTE WATER," filed on Jul. 26, 2006, all of which are herein incorporated by reference in their entireties for all purposes.

BACKGROUND OF INVENTION

1. Field of Invention

The present invention relates to a bioreactor system and method for treating wastewater, and more particularly to a wastewater treatment system and method utilizing a membrane bioreactor.

2. Discussion of Related Art

Biological treatment of wastewater is widely practiced. Wastewater is commonly treated with waste activated sludge, in which biological solids are acted upon by bacteria during a sludge residence time within a treatment tank. However, biological treatment produces unwanted waste sludge which must be appropriately disposed of. Waste sludge is commonly removed from the system and sent off-site for incineration or disposal in landfills.

Moreover, any organics present in the wastewater are acted upon by the bacteria only during a hydraulic retention time within a treatment tank. Because the hydraulic retention time is generally less than the sludge residence time, organics and recalcitrant organics in particular, may not be treated or destroyed. As a result, there are certain organic compounds that can pass through a treatment process unchanged to be discharged in either an effluent or residual sludge.

Powdered activated carbon is used in enhanced biological treatment processes allowing the organics to remain within the treatment tank for the hydraulic retention time and the sludge residence time to undergo both adsorptive and biological treatments. However, because both biological growth and adsorption of organic components occurs, wasting of excess solids is required. In addition, the powdered activated carbon is lost from the treatment process with the removal of biosolids and must, therefore, be continually replaced.

SUMMARY OF INVENTION

In accordance with one or more embodiments, the invention relates to a system and method of treating wastewater.

In one embodiment, a wastewater treatment system includes a source of wastewater and a bioreactor fluidly connected downstream of the source of wastewater. The bioreactor comprises an adsorbent. The system further includes an adsorbent regeneration unit fluidly connected downstream of the bioreactor.

In another embodiment, a wastewater treatment system comprises a source of wastewater and a bioreactor fluidly connected to the source of wastewater. The bioreactor comprises an adsorbent. A wet air oxidation unit is fluidly connected to the bioreactor.

Another embodiment is directed to a wastewater treatment system comprising a source of wastewater and a first bioreactor fluidly connected to the source of wastewater. The first bioreactor comprises an adsorbent. The wastewater treatment system also includes a second bioreactor fluidly connected downstream of the first bioreactor. The system further includes a separator fluidly connected downstream of the first bioreactor and upstream of the second bioreactor.

In another embodiment, a wastewater treatment system comprises a source of wastewater and a wet air oxidation unit comprising an inlet fluidly connected to the source of the wastewater and an outlet, and a membrane bioreactor comprising a biological population and fluidly connected to the outlet.

Another embodiment is directed to a method of treating wastewater including providing a source of wastewater and providing a bioreactor. The method further includes contacting the wastewater with an adsorbent and a biological population to produce a first product stream and regenerating a portion of the adsorbent in the first product stream to produce a second product stream. The second product stream is passed to the bioreactor.

Other advantages, novel features and objects of the invention will become apparent from the following detailed description of the invention when considered in conjunction with the accompanying drawings.

BRIEF DESCRIPTION OF DRAWINGS

The accompanying drawings, are not intended to be drawn to scale. In the drawings, each identical or nearly identical component that is illustrated in various figures is represented by a like numeral. For purposes of clarity, not every component may be labeled in every drawing, nor is every component of each embodiment of the invention shown where illustration is not necessary to allow those of ordinary skill in the art to understand the invention. In the drawings.

DETAILED DESCRIPTION

Figure 1:
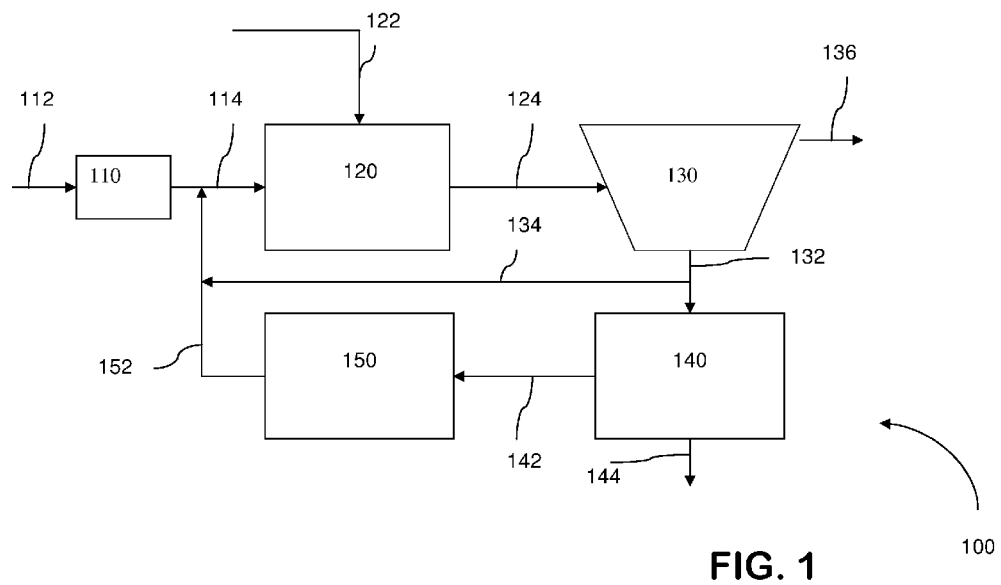
FIG. 1 is a block diagram illustrating a treatment system in accordance with one or more embodiments of the invention.

This invention is not limited in its application to the details of construction and the arrangement of components set forth in the following description or illustrated in the drawings. The invention is capable of other embodiments and of being practiced or of being carried out in various ways. Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

This invention in directed to wastewater treatment systems and methods. "Wastewater" as used herein, defines any water to be treated such as a stream of wastewater from industrial, agricultural and municipal sources, having pollutants of biodegradable material, inorganic or organic compounds capable of being decomposed by bacteria, flowing into the wastewater treatment system. Notably, the biomass requires an environment that provides the proper conditions for growth. As used herein, a "wastewater treatment system" is a system, typically a biological treatment system, having a biomass population of bacterial micro-organisms of a diversity of types of bacteria used to digest biodegradable material, with reduced solids production. Some wastewater treatment with reduced solids production is described in U.S. Pat. Nos. 6,660,163; 5,824,222; 5,658,458; and 5,636,755, each of which is incorporated by reference herein in their entireties for all purposes. It is understood that any water to be treated, such as municipal drinking water, may also benefit from one or more of the inventions described herein, and is, therefore, expressly included in the definition of wastewater as used herein.

Wastewater from industrial and municipal sources typically contains biological solids, inert material and organics, including refractory and recalcitrant organics. As used herein, recalcitrant organics define a class of organics which are slow or difficult to biodegrade relative to the bulk of organics in a wastestream. Examples of recalcitrant organics include synthetic organic chemicals, such as polyeletrolyte treatment chemicals. Other recalcitrant organics include polychlorinated biphenyls, polycyclic aromatic hydrocarbons, polychlorinated dibenzo-p-dioxin, and polychlorinated dibenzofurans. Endocrine disrupting compounds are also a class of recalcitrant organics which can affect hormone systems in organisms and are found in the environment. Examples of endocrine disrupting compounds include: alkylphenolics, such as nonylphenol used for removing oil as well as natural hormones and synthetic steroids found in contraceptives, such as 17-b-estradiol, estrone, testosterone, ethynyl estradiol.

Wastewater from industrial and municipal sources may also contain trace constituent compounds that originate during the water treatment process and are subsequently difficult to remove. Examples of trace constituents introduced during the water treatment process include nitrosamines, such as N-nitrosodimethylamine (NDMA) which may be released from proprietary cationic and anionic resins.

One embodiment of the present invention includes a bioreactor having one or more treatment zones. As used herein, the phrase "treatment zone" is used to denote an individual treatment region. Individual treatment regions may be housed in a single vessel with one or more compartments. Alternatively, individual treatment regions may be housed in separate vessels, wherein a different treatment is carried out in separate vessels. The treatment zone, i.e. the vessel, tank, or compartment, may be sized and shaped according to a desired application and volume of wastewater to be treated to provide a desired hydraulic retention time. Accordingly, a bioreactor may comprise one or more vessels. The bioreactor may comprise a membrane bioreactor having one or more filter membranes.

One or more of the treatment zones may be operated as a batch flow mode, a sequencing batch reactor, or as a continuous flow batch reactor having a continuous wastewater inflow. The treatment zone or zones may be operated under anoxic or aerobic conditions as desired for a particular purpose. The bacteria used in the individual treatment zones may be any bacteria or combination of bacteria suitable to thrive in anoxic and/or aerobic conditions. Representative aerobic genera, include the bacteria *Acinetobacter, Pseudomonas, Zoogloea, Achromobacter, Flavobacterium, Norcardia, Bdellovibrio, Mycobacterium, Shpaerotilus, Baggiatoa, Thiothrix, Lecicothrix*, and *Geotrichum*, the nitrifying bacteria *Nitrosomonas*, and *Nitrobacter*, and the protozoa Ciliata, Vorticella, Opercularia, and Epistylis. Representative anoxic genera include the denitrifying bacteria *Achromobacter, Aerobacter, Alcaligenes, Bacillus, Brevibacterium, Flavobacterium, Lactobacillus, Micrococcus, Proteus, Pserudomonas*, and *Spirillum*. Anaerobic organisms typically present include *Clostridium* spp., *Peptococcus anaerobus, Bifidobacterium* spp., *Desulfovibrio* spp., *Corynebacterium* spp., *Lactobacillus, Actinomyces, Staphylococcus* and *Escherichia coli*.

In addition to the bioreactor, the water treatment system may include pretreatment and/or post treatment units. Wet oxidation typically involves treatment of the wastewater with an oxidant, generally molecular oxygen from an oxygen-containing gas, at elevated temperatures and pressures. Wet oxidation at temperatures below the critical temperature of water, 374° C., is termed subcritical wet oxidation. Subcritical wet oxidation systems operate at sufficient pressure to maintain a liquid water. Wet oxidation systems and methods are described in U.S. Publication No. 20050171390, incorporated herein by reference in its entirety. In one embodiment, the Wet oxidation unit may be operated in a range between about 180° C. and about 325° C. In another embodiment, the wet oxidation unit may be operated at about 325° C.

In one embodiment a wet oxidation unit may be fluidly connected downstream of the bioreactor to further treat the effluent of the bioreactor. In another embodiment, a wet oxidation unit may be fluidly connected downstream of the bioreactor to treat the sludge removed from the bioreactor. In these instances, the wet oxidation unit may destroy any contaminants remaining with either the effluent or sludge leaving the membrane bioreactor.

In another embodiment, the wet oxidation unit may be fluidly connected upstream of the bioreactor to pretreat the wastewater. Pretreating a wastewater with a wet oxidation unit prior to treatment in a bioreactor may be advantageous in reducing or preventing any toxic upsets to the biological treatment in the bioreactor. Wet oxidation systems which utilize a direct chemical oxidation process are not subject to toxic upsets. Wet oxidation pretreatment of wastewater containing shock loads of toxic compounds may oxidize all or a portion of the toxic compounds to below shock levels for the downstream bioreactor. A bioreactor receiving effluent from a wet oxidation unit may therefore experience less instances of toxic upset. Moreover, carboxylic acids such as acetic acid, which are common by-products of wet oxidation may be biologically degraded in a membrane bioreactor downstream of the wet oxidation unit.

One embodiment of the present invention includes a plurality of bioreactors. As used herein, a single "bioreactor" includes one or more treatment zones or vessels. According to one embodiment, a first bioreactor may comprise a first biological population and an activated carbon disposed therein, wherein the biological population assimilates biodegradable components of the wastewater. As used herein, the phrase "biological population" defines a mixture of different bacterial micro-organisms. It is understood that the ratio of each of the different bacterial micro-organisms to one another may differ according to conditions and residence time within the bioreactors. The bioreactor may, but need not, be aerated depending on the desired conditions. Operating conditions of the bioreactor may be changed to alter growing conditions of the biological population. That is to say, operating conditions in a bioreactor may alternate between anoxic and aerobic conditions.

In another embodiment, the waste water treatment system may comprise one or more separation units suitable for a particular purpose fluidly connected to the bioreactor. In one embodiment, the wastewater treatment system may comprise one or more biosolids separation units downstream of the bioreactor to receive the mixed liquor. The biosolids separation unit may be any separation unit suitable for a particular purpose, such as a clarifier, ultrafiltration membranes, a membrane bioreactor, a hydrocyclone, and combinations thereof. In one embodiment, biosolids may settle in a clarifier unit with the assistance of known polymers. In another embodiment, the biosolids may remain in a membrane bioreactor for periodic removal as effluent is continually drawn out of the membrane bioreactor. The use of a membrane bioreactor and/or a hydrocylcone as a separation unit is advantageous in that the membrane bioreactor and the hydrocyclone do not require the presence of a settling polymer typically used with clarifiers. Therefore, the costs associated with purchasing and storing the polymer are avoided.

In yet another embodiment, a solid-liquid hydrocyclone may receive sludge from a bioreactor to further reduce the amount of water contained in the sludge, thereby reducing the total volume of sludge. In another embodiment, a liquid-liquid hydrocyclone may be fluidly connected upstream of a membrane bioreactor to remove contaminants that may foul the membranes. For example, oils which can foul membranes may be removed from the wastewater prior to passing the wastewater through a membrane bioreactor, thereby increasing the life of the membranes.

The wastewater treatment system may also comprise an inert solids separation unit or units suitable for a particular purpose. For example, the inert solids separation units may comprise a fine screen to remove inert trash, a hydrocyclone to remove heavy materials, and combinations thereof.

In addition to the biological population, the wastewater treatment system may comprise an adsorbent providing a wastewater/adsorbent slurry. Any adsorbent may be used, so long as the adsorbent removes one or more organics from the slurry, and a majority of the adsorbent remains with the overall slurry or generated sludge. The adsorbent may be any form suitable for a particular purpose, such as granulated, powdered, and combinations thereof. The adsorbent may be organic, inorganic, and combinations thereof. Examples of inorganic adsorbents include bentonite clay, iron based compounds, synthetic resins, and combinations thereof. In one embodiment, the adsorbent is granulated activated carbon, powdered activated carbon and combinations thereof. In another embodiment, the adsorbent is a commercially available powdered activated carbon.

In one embodiment, an adsorbent may be added to the bioreactor at any time during treatment of wastewater, as long as the adsorbent contacts the wastewater for a time sufficient to adsorb any organics which may be present in the wastewater. It is understood that the adsorbent may be introduced into the system at any location within the system, so long as the adsorbent is present in the desired bioreactor. For example, the adsorbent may be added to sludge to be recycled back to a bioreactor. Alternatively, the adsorbent may be added upstream of the bioreactor at a position before, and/or after one or more pretreatment units.

In one embodiment, the adsorbent is added to a bioreactor prior to introduction of the wastewater and the biological population. Alternatively, the adsorbent may be added to the bioreactor concurrently with or subsequent to the addition of wastewater. It is understood that at initial startup of the wastewater treatment system, an initial amount of adsorbent may be added to initially charge the bioreactor. The wastewater is treated in the biological treatment tank to produce a mixed liquor containing a mixture of biosolids, organics adsorbed on the adsorbent, and liquid.

The addition of an adsorbent to a bioreactor may increase the capture and/or destruction efficiencies of contaminants present in the wastewater. Because a solid adsorbent remains within the bioreactor until periodically removed, contaminants such as organics adsorbed on the adsorbent have a longer residence time within the bioreactor compared to contaminants that are not adsorbed. Organics not adsorbed would pass directly out of the bioreactor with a first liquid effluent. An increased residence time of organics, and more particularly of slow to degrade organics, within the bioreactor is particularly advantageous when treating recalcitrant organics, which are difficult and slow to degrade. The increase residence time of the organics may result in an increased and/or complete destruction of recalcitrant organics. The adsorption of any volatile organic compounds present in the wastewater my also reduce VOC stripping and odor release.

In one embodiment, the presence of powdered activated carbon in aerobic bioreactors may increase the efficiency of the aeration device because activated carbon exhibits an attraction for gaseous oxygen.

The use of an adsorbent, such as powdered activated carbon, with a membrane bioreactor may result in additional advantages. Powdered activated carbon may aid the membrane filtration process by removing extracellular polymeric substances (EPS) generated from the biomass. The generation of EPS may foul membrane bioreactors operating with extended sludge retention times (SRTs) and/or high mixed liquor suspended solids (MLSS). Reduction or elimination of the EPS may assist to maintain an environment suitable to the biomass and extend the life of the membrane. Adsorption of contaminants by the powdered activated carbon present in the bioreactor may also reduce or eliminate the incidence of toxic shock to the bioreactor which may be caused by large quantities of these contaminants.

The presence of powdered activated carbon within a membrane bioreactor may also aid in the adsorption of organic compounds and/or metals which may irreversibly foul the membranes. In one embodiment, organic compounds such as siloxanes, may be adsorbed on the powdered activated carbon thereby reducing or eliminating the detrimental effects of siloxanes on the membranes. Adsorption of the metals by the powdered activated carbon may reduce or eliminate the presence of the metals found in leachates, such as inert salt of iron, calcium, magnesium and manganese.

The presence of powdered activated carbon in a membrane bioreactor may also result in a less viscous mixed liquor than a pure biological sludge with the same biosolids concentration. In membrane filtration, the viscosity of the sludge in the membrane environment is directly proportional to the energy required for membrane filtration. The fouling rate of membranes in a membrane bioreactor is generally proportional to the flux rate on an exponential curve so that reduction of the MLSS viscosity with the addition of powdered activated carbon may improve both the flux capacity of the membranes and reduce capital and energy consumption costs. The combination of powdered activated carbon in a membrane bioreactor will allow the operation of higher mixed liquor concentrations which may reduce the bioreactor size and associated capital and installation costs.

Powdered activated carbon in a membrane bioreactor may aid in physically scrubbing the membrane surface, which may result in a higher operating flux and reduce the clean in place frequency, thereby extending the life of the membrane and reducing the associated clean in place costs. Combining powdered activated carbon with membrane bioreactors may also result in a more stable removal of ammonia. The powdered activated carbon may remove substances inhibitory to sensitive nitrifiers, which membrane bioreactors alone cannot do.

The use of powdered activated carbon in bioreactors has a significant advantage in that it may be regenerated and reused. In one embodiment, sludge containing powdered activated carbon may be regenerated in a wet oxidation unit, denoted herein as wet air regeneration. Wet air regeneration of activated carbons may be carried out at temperatures less than those for wet oxidation. For example, a sludge containing biosolids and powdered activated carbon may be wet air regenerated at temperatures of about 240° C. to about 260° C. The wet oxidation regeneration of carbon destroys the volatile portion of the biological solids and oxidizes the organic substances adsorbed on the surface of the powdered activated carbon to restore its adsorptive capacity. The recovered aqueous slurry from the wet oxidation regeneration process consists primarily of reactivated carbon particles and inorganic ash particles removed from the wastewater by the carbon and formed during the regeneration process. The ash may be further separated from the regenerated carbon by known separation methods such as those reported in U.S. Pat. Nos. 4,778,598 and 4,749,492, both of which are incorporated herein by reference in their entireties for all purposes.

Powdered activated carbon regenerated by wet air reduction may produce a better quality effluent when returned to the bioreactor than virgin powdered activated carbon. The regenerated powdered activated carbon may have different adsorptive properties then virgin powdered activated carbon, thereby increasing the adsorptive qualities. Wet air regeneration of powdered activated carbon may alter pore structure to become more suitable to remove inhibitory, toxic, and /or refractory materials from wastewater. Similarly, wet air regeneration of powdered activated carbon may alter pore structure to become less suitable to remove materials which may be biologically assimilated. Wet air regeneration of powdered activated carbon may affect surface chemistry thereby changing its overall adsorptive properties. Wet air regeneration of powdered activated carbon may alter its surface chemistry resulting in carbon structure that is more resistant to further oxidation within the wet air oxidation unit.

Wet air regeneration may also place a soluble component into the mixed liquor of the bioreactor which may enhance bioactivity and create a more diverse biological population. Wet air regeneration may also place ammonia nitrogen back into the mixed liquor that may reduce or eliminate the nutrient nitrogen requirements of these wastes that are nitrogen deficient, thereby saving chemical and operating costs. The wet air regeneration process is also autothermic, so that heat may be recovered and supplied to other units, such as a digester. As used herein the work "autothermic" refers to gasification methods in which the reaction heat needed in the unit is supplied by partial oxidation within the unit. Additional energy to be supplied to the wet air regeneration unit may be provided by on-site incineration of a portion of the waste sludge.

Powdered activated carbon may also be regenerated in a second bioreactor. The second biological treatment tank may be operated under conditions different from conditions in the first bioreactor to provide favorable growth of a biological population having a different ratio of bacterial organisms than a ratio of bacterial organisms in the first biological population present in the first bioreactor. For example the first bioreactor may be dominated by an aerobic bacterial population and the second biological treatment tank may be dominated by a facultative population which may destroy any aerobic bacteria biosolids. The facultative bacteria further directed to the first biological treatment tank may be subsequently destroyed in the first bioreactor.

In one embodiment, the biological population in the second biological treatment tank may further assimilate the biosolids and regenerate the activated carbon present in the biosolids by further reacting with the adsorbed organics. The bacteria in the second bioreactor may be specifically selected for its ability to act on the organics adsorbed on the activated carbon and/or to minimize an amount of biosolids to be removed from the wastewater treatment system. For example, the bacterial population present in the second bioreactor may exhibit lower solids yield and a higher waste-digestion efficiency relative to the bacteria in the first bioreactor, thereby minimizing the generation of solids and subsequently the amount of solids to be removed from the wastewater treatment system.

The second bioreactor may comprise one or more continuous flow tanks and/or one or more batch process tanks. In one embodiment utilizing continuous flow tanks, circulated sludge enters one or more tanks either continuously or periodically. The tank volumes may be essentially constant so corresponding volume overflows and returns to the waste treatment system. In one embodiment, sludge may be exchanged between tanks. Mixing and aeration may be provided to the second bioreactor to control the environment. In another embodiment utilizing batch process tanks, circulated sludge enters one or more tanks either continuously or periodically. The tank volumes may be variable so return of conditioned sludge to the first biological treatment tank may not correspond to the feed. Mixing and aeration may be provided to control the environments. The sludge may be treated in a batch cycle that may include one or more of: filling the tank, mixing, settling, aeration, decant, and return of sludge to the treatment process, in any order to achieve a desired purpose.

The resulting regenerated powdered activated carbon may be recycled back to the first bioreactor in one or more recirculation lines thereby reducing the amount of solids to be removed from the wastewater treatment system. One advantage of the present invention may be that by reducing the amount of solids to be removed from the wastewater treatment system, the amount of activated carbon that is removed with the solids may also be reduced, resulting in lower costs associated with using less activated carbon.

Another advantage of the present invention is that retaining a substantial amount of the activated carbon with adsorbed organics within the wastewater treatment system allows the organics adsorbed on the activated carbon to remain in the wastewater treatment system for further treatment and destruction. The organics adsorbed on the activated carbon have a longer residence time within the wastewater treatment system compared to organics that are not adsorbed on activated carbon and would pass directly out of the wastewater treatment system with a first liquid effluent. An increased residence time of organics within the wastewater treatment system is particularly advantageous when treating recalcitrant organics, which are difficult and slow to degrade. The increase residence time of the organics may result in an increased and/or complete destruction of recalcitrant organics.

Another advantage of the present invention is that the activated carbon may be continuously regenerated by the biological action of microorganisms in the wastewater treatment process, eliminating a separate regeneration step of activated carbon that is typically removed from wastewater treatment systems.

Sludge containing the spent powdered activated carbon may be continuously, periodically, or intermittently removed from a bioreactor, such as a membrane bioreactor. Removal of the sludge containing spent powdered activated carbon may be automatically or manually initiated, and if desired, the sludge containing the spent powdered activated carbon may, but need not, be directed to a holding tank prior to being regenerated. For example, a membrane bioreactor may have a hydraulic detention time of between about 6 and about 18 hours, while the solids retention time may be from about 10 to about 40 days. The solids containing the spent powdered activated carbon may be completely removed at a predetermined interval based upon duration within the bioreactor. In one embodiment, a portion such as 10 percent by volume of the solids containing spent powdered activated carbon may be removed daily. The regenerated activated carbon may be returned to the bioreactor, continuously, periodically, and intermittently.

As illustrated in FIG. 1, some wastewater treatment systems 100 of the invention may comprise a bioreactor 120, a separator 130, an optional inert solids separator 140, a powdered activated carbon regeneration unit 150, and an optional screen 110. Wastewater to be treated enters the wastewater treatment system 100 through conduit 112 and passes through a gross filter screen 110. Screen 110 may have an opening size that may range from about 25 mm down to about 6 mm to remove large items of trash. The trash accumulating on a receiving face of screen 110 may be periodically removed.

The screened liquid is conveyed along conduit 114 to the first biological treatment tank 120 containing one or more desired bacteria. Powdered activated carbon is initially added to the first biological treatment tank 120 via conduit 122.

Wastewater entering the biological treatment tank 120 contacts the powdered activated carbon and the bacterial population which digest biodegradable components in the wastewater producing a mixed liquor. The first bioreactor is operated under conditions favorable for growth of the desired bacteria. Organics, including recalcitrant organics, present in the wastewater may be adsorbed on the powdered activated carbon.

The mixed liquor and powdered activated carbon carrying the organics pass to biomass separator 130 along conduit 124. Separator 130 may be any separator suitable for a particular purpose. In one embodiment, separator 130 is a solid-liquid hydrocyclone. In another embodiment, separator 130 is a membrane bioreactor. Biomass in the mixed liquor and the powdered activated carbon are separated from the effluent and are removed from separator 130 via conduit 132. Effluent is removed from an outlet of separator 130 via conduit 136.

A portion of the combined biomass and powdered activated carbon carrying organics is directed back to bioreactor 120 via conduits 134, 152 and 114. The bacterial population present in the combined biomass and powdered activated carbon repopulate biological tank 120 with the desired bacterial population.

Another portion of the combined biomass and powdered activated carbon carrying organics is directed to an optional inert solid separator 140 via conduit 132 to remove fine inert heavy material. Inert solid separation subsystem comprises a fine screen and hydrocyclone. Inert solids removed from the combined biosolids and powdered activate carbon carrying organics are removed via conduit 144 without removing a significant portion of the biosolids and the powdered activated carbon, so that a substantial amount of the initial activated carbon remains in the wastewater treatment system.

The remaining mixture of biosolids and powdered activated carbon carrying organics is conveyed as sludge to regeneration unit 150 vial conduit 142. In one embodiment, regeneration unit 150 is a wet air regeneration unit operating at sufficient temperature and pressure to regenerate the powdered activated carbon as well as to destroy one or more contaminants remaining in the sludge from the separator. The reactivated powdered activated carbon and sludge is removed from the wet air regeneration unit 150 and conveyed to bioreactor 120 via conduits 152 and 114.

In another embodiment, the separator 150 is a second bioreactor. In the second bioreactor, the sludge is exposed to anaerobic, anoxic and aerobic conditions regulated by mixers and an aeration system (not shown), as appropriate for growth of the desired bacterial population. The bacteria further digest the biosolids as well as destroy the organics adsorbed on the powdered activated carbon. The destruction of the organics on the powdered activated carbon regenerates the powdered activated carbon. A second mixed liquor is removed from the second bioreactor 150 and conveyed to the first bioreactor 120 via conduits 152 and 114.

In yet another embodiment, a second regeneration unit (not shown) may be fluidly connected downstream of regeneration unit 150. For example, a wet air regeneration unit (not shown) may be fluidly connected downstream of the second bioreactor 150 to further regenerate at least a portion of any remaining spent powdered activated carbon, as well as to increase the destruction of contaminants remaining with the sludge/powdered activated carbon mix. Similarly, a second bioreactor (not shown) may be fluidly connected downstream of wet air regeneration unit 150 to further regenerate at least a portion of any remaining spent powdered activated carbon and/or to increase the destruction of any contaminants remaining with the sludge/powdered activated carbon mix.

In another embodiment, effluent exiting separator 130 via line 136 may be further treated in a wet oxidation unit (not shown) to further increase the destruction of contaminants remaining with the effluent.

During operation of the wastewater treatment system, powdered activated carbon may be added to the first bioreactor 120 on an as needed basis, to replace any powdered activated carbon inadvertently removed during the various solids separation stages, for example, during removal of inert solids. However, as the removal of biosolids from the wastewater treatment system is reduced when compared to typical wastewater treatment systems, the inadvertent loss of the powdered activated carbon may also be reduced, resulting in lower raw material costs for powdered activated carbon. Retaining the powdered activated carbon within the wastewater treatment system increases the residence time of organics adsorbed on the powdered activated carbon, thereby increasing the destruction efficiency of the organics and may provide for complete destruction of recalcitrant organics.

Figure 2:
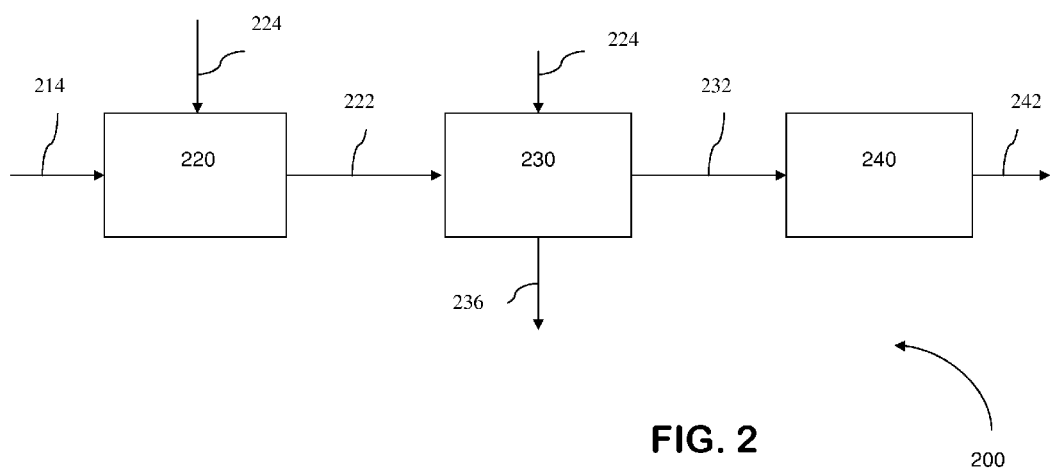
FIG. 2 is a block diagram illustrating another treatment system in accordance with one or more embodiments of the invention.

FIG. 2 illustrates another embodiment of the invention. Wastewater treatment system 200 may comprise a bioreactor 220, a membrane bioreactor 230 and a wet oxidation unit 240. Wastewater to be treated enters the wastewater treatment system through conduit 214 and contacts a bacterial population which digest biodegradable components in the waste waster producing a mixed liquor. The mixed liquor passes to membrane bioreactor 230 via conduit 222 for further treatment. Powdered activated carbon may be added directly to bioreactor 220 and/or directly to membrane bioreactor 230 through lines 224 and 234, respectively. Mixed liquor containing biomass and powdered activated carbon may be passed to a regeneration unit (not shown) via conduit 236. Effluent exiting membrane bioreactor 230 via conduit 232 is directed to wet oxidation unit 240 for further treatment of slow to degrade contaminants. Effluent from wet oxidation unit 240 exits via conduit 242 for release, reuse, or additional treatment.

Figure 3:
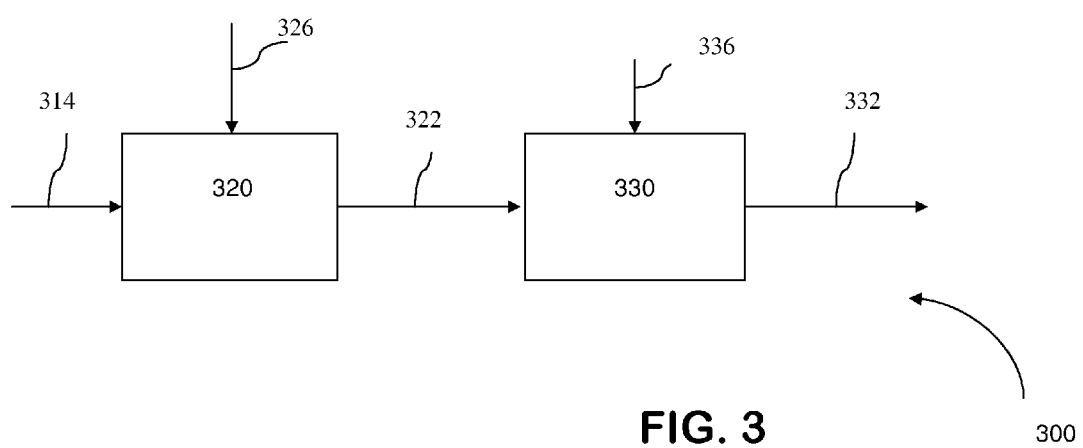
FIG. 3 is a block diagram illustrating another treatment system in accordance with one or more embodiments of the invention.

FIG. 3 illustrates another embodiment of the wastewater treatment system of the present invention. Wastewater treatment system 300 comprises a wet oxidation unit 320 fluidly connected upstream of a membrane bioreactor 330. Wastewater enters wet oxidation unit 320 via conduit 314 for oxidation. Because membrane bioreactor receives effluent from a wet oxidation unit, it may therefore experience less instances of toxic upset. Moreover, undesirable byproducts from wet oxidation such as carboxylic acids may be biologically degraded in a membrane bioreactor downstream 330 of the wet oxidation unit. Resultant effluent passes to membrane bioreactor 330 via conduit 322. Effluent from membrane bioreactor 330 exits via conduit 332 for further treatment, reuse, or release. Optionally, powdered activated carbon my be added to wet oxidation unit 330 via conduit 326 and/or added to membrane bioreactor 330 via conduit 336.

Figure 4:
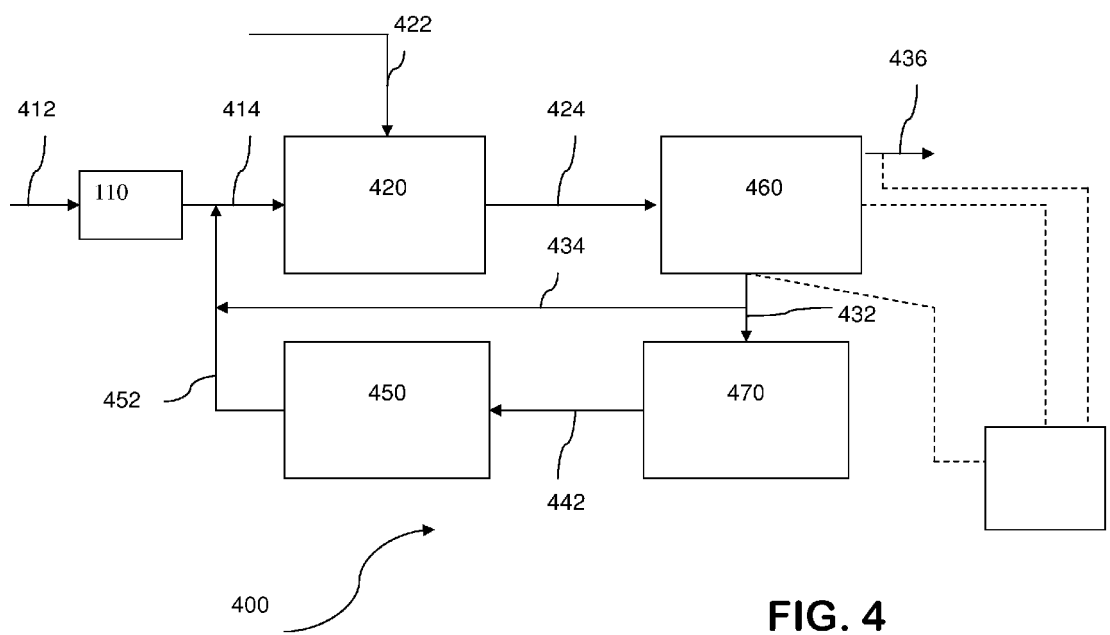
FIG. 4 is a block diagram illustrating another treatment system in accordance with one or more embodiments of the invention.

Some aspects of the invention may be particularly directed to controlling the waste treatment operations. For example, FIG. 4 illustrates a wastewater treatment system 400 similar to wastewater treatment system 100 shown in FIG. 1. Wastewater treatment system 400 comprises a bioreactor 420, a separator 430, an optional inert solids separator 440, a powdered activated carbon regeneration unit 450, and an optional screen 410. Wastewater to be treated enters the wastewater treatment system 400 through conduit 412 and passes through a gross filter screen 410.

The screened liquid is conveyed along conduit 414 to the first biological treatment tank 420 containing one or more desired bacteria. Powdered activated carbon is initially added to the biological treatment tank 420 via conduit 422.

Wastewater entering the biological treatment tank 420 contacts the powdered activated carbon and the bacterial population which digest biodegradable components in the wastewater producing a mixed liquor. The first bioreactor is operated under conditions favorable for growth of the desired bacteria. Organics, including recalcitrant organics, present in the wastewater may be adsorbed on the powdered activated carbon.

The mixed liquor and powdered activated carbon carrying the organics pass to membrane bioreactor 460 along conduit 424. Biomass in the mixed liquor and the powdered activated carbon are separated from the effluent and are removed from membrane bioreactor 460 to holding tank 470 via conduit 432. Effluent is removed from an outlet of the membrane bioreactor via conduit 436.

A portion of the combined biomass and powdered activated carbon carrying organics is directed back to bioreactor 420 via conduits 434, 452 and 414. The bacterial population present in the combined biomass and powdered activated carbon repopulate biological tank 420 with the desired bacterial population.

The remaining mixture of biosolids and powdered activated carbon carrying organics is conveyed as sludge to wet air regeneration unit 450 vial conduit 442. Wet air regeneration unit 450 operates at sufficient temperature and pressure to regenerate the powdered activated carbon as well as to destroy one or more contaminants remaining in the sludge from the separator.

Controller 500 may respond to signals from timers (not shown) and or sensors (not shown) positioned at any particular location within the system. For example, a sensor positioned in membrane bioreactor 460 may indicate less than optimum conditions in the membrane bioreactor. The sensors may monitor one or more operational parameters such as pressure, temperature, membrane flux, one or more characteristics of the mixed liquor suspended solids, and/or one or more characteristics of the treated effluent. Controller 500 may respond by generating a control signal causing all or a portion of the solids containing spent powdered activated carbon to be removed from the membrane bioreactor. Similarly, a sensor (not shown) positioned in conduit 436 may indicate that contaminant levels remaining in the effluent from the membrane bioreactor have reached an undesirable level. Controller 500 may again respond by generating a control signal causing all or a portion of the solids containing spent powdered activated carbon to be removed from the membrane bioreactor.

The system and controller of one or more embodiments of the invention provide a versatile unit having multiple modes of operation, which can respond to multiple inputs to increase the efficiency of the wastewater treatment system.

Figure 5:
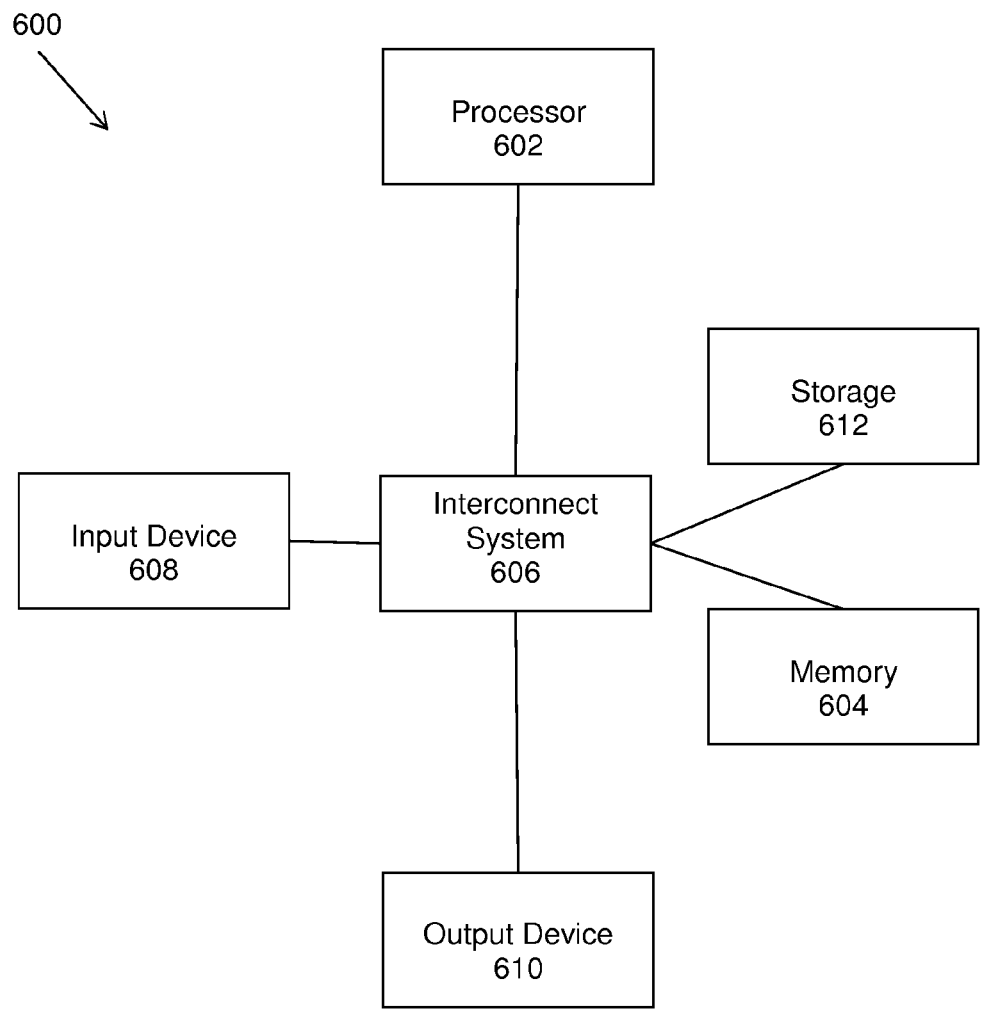
FIG. 5 is a schematic diagram illustrating a computer system upon which one or more embodiments of the invention may be practiced.

The controller of the system of the invention 500 may be implemented using one or more computer systems 600 as exemplarily shown in FIG. 5. Computer system 600 may be, for example, a general-purpose computer such as those based on in Intel PENTIUM®-type processor, a Motorol PowerPC® processor, a Hewlett-Packard PA-RISC® processor, a Sun UltraAPARC® processor, or any other type of processor or combination thereof. Alternatively, the computer system may include specially-programmed, special-purpose hardware, for example, an application-specific integrated circuit (ASIC) or controllers intended for water treatment systems.

Computer system 600 can include one or more processors 602 typically connected to one or more memory devices 604, which can comprise, for example, any one or more of a disk drive memory, a flash memory device, a RAM memory device, or other device for storing data. Memory 604 is typically used for storing programs and data during operation of the system 400 and/or computer system 600. For example, memory 604 may be used for storing historical data relating to the parameters over a period of time, as well as operating data. Software, including programming code that implements embodiments of the invention, can be stored on a computer readable and/or writeable nonvolatile recording medium (discussed further with respect to FIG. 6), and then typically copied into memory 604 wherein it can then be executed by processor 602. Such programming code may be written in any of a plurality of programming languages, for example, Java, Visual Basic, C, C#, or C++, Fortran, Pascal, Eiffel, Basic, COBAL, or any of a variety of combinations thereof.

Components of computer system 600 may be coupled by one or more interconnection mechanisms 606, which may include one or more busses (e.g., between components that are integrated within a same device) and/or a network (e.g., between components that reside on separate discrete devices). The interconnection mechanism typically enables communications (e.g., data, instructions) to be exchanged between components of system 600.

Computer system 600 can also include one or more input devices 608, for example, a keyboard, mouse, trackball, microphone, touch screen, and other man-machine interface devices as well as one or more output devices 610, for example, a printing device, display screen, or speaker. In addition, computer system 600 may contain one or more interfaces (not shown) that can connect computer system 600 to a communication network (in addition or as an alternative to the network that may be formed by one or more of the components of system 600).

According to one or more embodiments of the invention, the one or more input devices 608 may include sensors for measuring parameters of system 400 and/or components thereof. Alternatively, the sensors, the metering valves and/or pumps, or all of these components may be connected to a communication network (not shown) that is operatively coupled to computer system 600. Any one or more of the above may be coupled to another computer system or component to communicate with computer system 600 over one or more communication networks. Such a configuration permits any sensor or signal-generating device to be located at a significant distance from the computer system and/or allow any sensor to be located at a significant distance from any subsystem and/or the controller, while still providing data therebetween. Such communication mechanisms may be affected by utilizing any suitable technique including but not limited to those utilizing wireless protocols.

Figure 6:
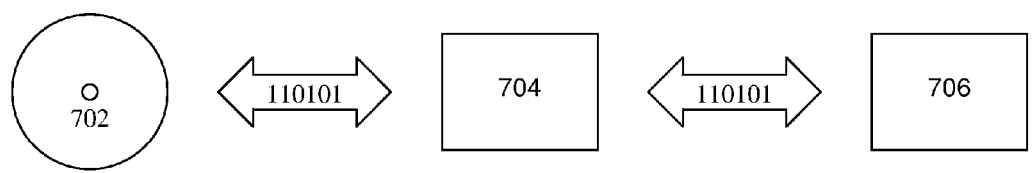
FIG. 6 is a schematic illustration of a storage system that may be used with the computer system of FIG. 5 in accordance with one or more embodiment so the invention.

As exemplarily shown in FIG. 6, controller 600 can include one or more computer storage media such as readable and/or writeable nonvolatile recording medium 702 in which signals can be stored that define a program to be executed by one or more processors 602. Medium 702 may, for example, be a disk or flash memory. In typical operation, processor 602 can cause data, such as code that implements one or more embodiments of the invention, to be read from storage medium 702 into a memory 704 that allows for faster access to the information by the one or more processors than does medium 702. Memory 704 is typically a volatile, random access memory such as a dynamic random access memory (DRAM) or static memory (SRAM) or other suitable devices that facilitates information transfer to and from processor 602.

Although computer system 600 is shown by way of example as one type of computer system upon which various aspects of the invention may be practiced, it should be appreciated that the invention is not limited to being implemented in software, or on the computer system as exemplarily shown. Indeed, rather than implemented on, for example, a general purpose computer system, the controller, or components or subsections thereof, may alternatively be implemented as a dedicated system or as a dedicated programmable logic controller (PLC) or in a distributed control system. Further, it should be appreciated that one or more features or aspects of the invention may be implemented in software, hardware or firmware, or any combination thereof. For example, one or more segments of an algorithm executable by controller 500 can be performed in separate computers, which in turn, can be communication through one or more networks.

EXAMPLES

Example I

Bench scale studies were conducted to evaluate the impact of PACT® powdered activated carbon treatment and wet air oxidation on the removal of EDCs from activated sludge treatment.

Two bench scale aerobic reactors were used and operated simultaneously side-by-side. Each bench scale reactor included a 10 L stainless steel cylindrical aeration tank with a mechanical mixer and peristaltic feed and effluent pumps, which transferred feed to and effluent from the aeration tank. Each aeration tank was equipped with an air diffuser at the bottom of the tank to deliver compressed air. Each aerobic reactor was operated in a sequencing batch mode comprising of a fill cycle, an aeration cycle, a quiescent cycle, and a decant cycle. Programmable timers sequenced through the various cycles controlling the batch operation. The pH of each aeration tank was controlled using a system that automatically added acid or caustic to the tank on demand. The influent waste was pumped into the reactor where it was mixed with the biological solids in a first reactor and a mixture of biological solids and activated carbon in a second reactor. The wastewater and solids mixture was aerated for a sufficient period of time to affect biological oxidation and assimilation, at which time aeration was interrupted. The hydraulic retention time (HRT) for each reactor was about 6 hours. The solids in the mixed liquor in both units were allowed to accumulate to approximately the same concentration. The solids were allowed to settle and the effluent was decanted from the top of the reactor. After removal of the effluent, each batch reactor was again filled with influent wastewater and the cycles were repeated.

Prior to conducting this study, four commercially available powdered activated carbons were evaluated for EDC removal by generating adsorption isotherms for each of the activated carbons. The adsorption isotherm represents a relationship between the amount of contaminant adsorbed per unit weight of carbon and the remaining concentration of the contaminant. The experimental results are plotted on a log-log graph, with the concentration of residual contaminant on the X-axis and the amount of contaminant adsorbed per unit of adsorbent on the Y-axis.

In the carbon adsorption isotherm procedure, the carbon was filtered from the sample after the contact period. In order to determine if filtering with a 0.45 micron filter had any effect on EDC removal, analysis was conducted on a sample of the modified synthetic feed and a filtered sample of the modified synthetic feed. The synthetic feed mixture modified with EDCs was used throughout the experiments included:

| | |
|---|---|
| Glucose | 165 mg/L |
| Sodium acetate | 200 mg/L |
| Ammonium hydrogen phosphate | 40 mg/L |
| Urea | 40 mg/L |
| Centrum ® liquid | 5 mg/L |

The following endocrine disrupting chemicals were added to the above feed.

| | |
|---|---|
| Bisphenol A | 267 ng/L |
| Estradiol | 2000 ng/L |
| Ethynyl estradiol | 23 ng/L |
| Estrone | 235 ng/L |

The analytical results indicated that the concentration of bisphenol A is reduced after filtering. Table I is a summary of those results.

TABLE I

EDC Removal Due to Filtering (Concentration in ng/L)

| Sample | Modified Feed | Filtered Modified Feed |
|---|---|---|
| bisphenol A | 262.67 | 27.7 |
| β estradiol | 1941.24 | 2064.56 |
| ethynyl estradiol | 2.85 | 2.36 |
| estrone | 222.88 | 282.65 |

EDC adsorptions on various carbon media were tested in order to select a carbon suited to remove EDCs. Lignite, bituminous, and wood based carbon were tested. The carbons tested included Westvaco Nuchar SA-20 available from MeadWestvaco, Co. (Covington, Va.) denoted as Carbon A; Norit Hydrodarco C denoted available from Norit Americas, Inc. (Marshall, Tex.) as Carbon B; Jacobi Aquasorb BP-4 available from Jacobi Carbons (Philadelphia, Pa.) denoted as Carbon C; and Calgon WPX available from Calgon Carbon Corp. (Pittsburgh, Pa.) denoted as Carbon D. Table II is a summary of the residual EDC concentration for the various carbon media tested.

TABLE II

Residual EDC Concentrations (ng/L)

| | Carbon Dose | | |
|---|---|---|---|
| | 250 mg/L | 500 mg/L | 1000 mg/L |
| Carbon A | | | |
| Bisphenol A | 9.9 | 5.53 | 4.31 |
| β estradiol | 4.15 | 0.73 | 0.25 |
| Ethynyl estradiol | nd | 0.01 | nd |
| Estrone | nd | 0.05 | 12.61 |
| Carbon B | | | |
| Bisphenol A | 4.84 | 5.3 | 3.16 |
| β estradiol | 1.66 | 0.84 | 0.54 |
| Ethynyl estradiol | nd | nd | 0.02 |
| Estrone | nd | 0.13 | nd |
| Carbon C | | | |
| Bisphenol A | 3.09 | 3.94 | 4.33 |
| β estradiol | 2.54 | 3.84 | 1.17 |
| Ethynyl estradiol | nd | nd | 0.17 |
| Estrone | 0.02 | 1.27 | 0.10 |
| Carbon D | | | |
| Bisphenol A | 0.52 | 10.12 | 3.72 |
| β estradiol | 2.63 | 0.48 | 0.01 |
| Ethynyl estradiol | 1.14 | 0.39 | nd |
| Estrone | 1.05 | nd | nd |

Figure 7:
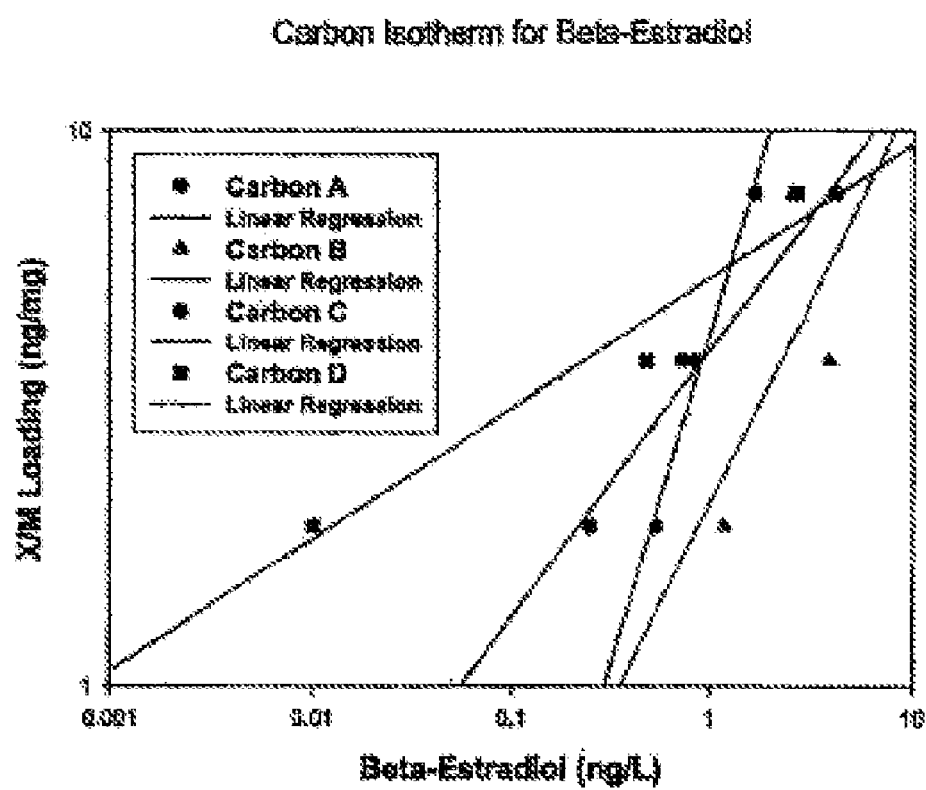
FIG. 7 is a carbon adsorption isotherm graph of one or more embodiments of the invention.

Carbon adsorption isotherms for each of the four carbons were prepared from the estradiol data. The isotherms were not prepared using the ethynyl estradiol and estrone results because of the large number of non detectable results. The results from Bisphenol A were also not used because of the filterability of this compound. The following char illustrates the carbon adsorption isotherm for estradiol for each of the four carbons. As seen in FIG. 7, the isotherms indicate that Carbon D exhibited superior beta estradiol adsorption capabilities and can achieve lower concentration in the treated samples. Carbon D was therefore chosen for further testing.

Each system was operated under equivalent conditions as shown in Table III.

TABLE III

Operating Data Activated Sludge Systems

| | Average Values | |
|---|---|---|
| Parameter | With PAC | Without PAC |
| Hydraulic Retention Time, Hours | 6 | 6 |
| Carbon Dose, mg/L | 250 | — |
| Oxygen Uptake Rate, mg/L/hr | 12.1 | 16.6 |
| Mixed Liquor D.O., mg/L | 6.77 | 6.9 |
| Mixed Liquor pH | 7.14 | 7.17 |
| Mixed Liquor Tem, ° C. | 30.0 | 29.7 |
| Mixed Liquor SS, mg/L | — | 2500 |
| Biomass, mg/L | 5700 | — |
| Carbon, mg/L | 13100 | — |

Activated sludge system operating parameters maintained for the activated sludge system with and without powdered activated carbon tabulated in Table III indicate both systems were operated at equivalent hydraulic retention times and mixed liquor concentrations, the difference being that one system contained powered activated carbon.

EDC Analysis

Samples were extracted and a sample concentration was achieved by filtering a two liter sample through a C18 high performance extraction disk. The C18 disk was cleaned with 10 ml of a 50/50 dichloromethane (DCM)/ethyl acetate solution and conditioned with 10 ml methanol followed by a 20 ml type I water rinse. The 2 L sample was filtered through the disk and then eluted first with 5 ml of ethyl acetate, then 5 ml of a 50/50 mixture of ethyl acetate and DCM, followed by a 5 ml DCM alone. The extracts were blown to near dryness with nitrogen and transferred with several ethanol rinses to a calibrated 2 mL amber vial, dried to near dryness and brought back up to 1.5 mL in ethanol. Samples were stored in a 4° C. cooler until analyzed.

The samples were analyzed using HPLC-MS-MS techniques. HLPC separation was carried out on an Agilent 1100 system available from Agilent Technologies, Inc. (Santa Clara, Calif.), which consisted of an autosampler, a binary gradient pump, a solvent degassing unit, and a column compartment with oven. The analytical column was a Phenomenex Synergi MAX-RP (250 mm×4.6 mm, with four micron pore size) available from Phenomenex (Torrance, Calif.) which was kept at room temperature during analysis. Sample injections of 15 microliters were analyzed with gradient elution at 0.7 mL/minute. Solvent A was 0.1% formic acid and Solvent B was acetonitrile. The gradient was programmed as follows: 0-2 minutes—95% A; 2-10 minutes—step change to 100% B; 10-20 minutes—step change back to 95% A for column re-equilibration prior to next injection. MS/MS analysis was carried out on a SCIEX API 4000 triple quadrupole mass spectrometer available from MDS Sciex (Concord, ON, Canada). Ionization was achieved with Positive Mode Atmospheric pressure Chemical Ionization. Identification and quantification of the target analytes was achieved by Multiple Reaction Monitoring of unique parent to daughter ion transitions.

Samples of the feeds, effluents and mixed liquors were also analyzed as follows in Table IV.

TABLE IV

Analytical Methods

| Measurement Parameter | Abbreviation | Method | Reference |
|---|---|---|---|
| Chemical Oxygen Demand | COD | Dichromate Reflux | EPA 410.4 |
| Biochemical Oxygen Demand | BOD | 5 day, 20 Degrees C. | EPA 405.1 |
| Suspended Solids | SS | Gravimetric | EPA 160.2 |
| Total Kjeldahl Nitrogen | TKN | Block Digester | EPA 351.2 |
| Ammonia Nitrogen | $NH_3$—N | Automated Phenate | EPA 350.1 |
| Nitrite Nitrogen | $NO_2$—N | Ion Chromatography | EPA 300.0 |
| Nitrate Nitrogen | $NO_3$—N | Ion Chromatography | EPA 300.0 |
| Total Phosphorus | TP | Automated Ascorbic | EPA 365.4 |
| Carbon/Biomass | — | Nitric Acid Digestion | |

The activated sludge units were put into operation and run for about 8 weeks with samples taken at 2, 6, 7 and 8 weeks, shown in Table V.

In order to access the EDC removal in the effluent, the effluents from the activated sludge processes were filtered before submittal for analysis. A Whatman 0.45 microgram cellulose nitrate membrane filter was used for this procedure. Table V is a summary of the analytical results for the feed and effluents of the activated sludge treatment systems, all values are ng/L.

TABLE V

Hormone and Phthalate Results Activated Sludge Systems

| Parameter | Feed | With PAC | No PAC | Feed | With PAC | No PAC |
|---|---|---|---|---|---|---|
| | | 2 weeks | | | 6 weeks | |
| bisphenol A | 9.56 | 0.45 | 0.39 | 33 | 1.2 | <1 |
| β estradiol | 2519.23 | <1 | 22.22 | 1385 | <1 | <1 |
| Ethynyl estradiol | 12.23 | <1 | <1 | 23 | <1 | <1 |
| Estrone | 368.76 | <1 | <1 | 511 | <1 | <1 |
| | | 7 weeks | | | 8 weeks | |
| bisphenol A | 32 | <1 | 1.0 | 14 | <1 | <1 |
| β estradiol | 1519 | 1.1 | 2.4 | 843 | $4.2^2$ | 1.7 |
| Ethynyl estradiol | 1.4 | <1 | <1 | <1 | <1 | <1 |
| Estrone | 347 | <1 | 1.7 | 159 | <1 | <1 |

In all but one test, the system operating with PAC showed a greater reduction in β estradiol. The result of 4.2 ng/L is assumed to be due to analytical error and not representative of the actual value based on the pseudo duplicate analysis from the sample day and prior analysis, the actual value is likely <1 ng/L. The presence of powdered activated carbon in the activated sludge system increased the removal of EDCs from the sludge.

EXAMPLE II

A study was conducted to determine the impact of wet air oxidation on the destruction of EDCs associated with those solids, and to determine if EDCs of the type tested would be formed during the oxidation process.

The WAO tests were performed in a laboratory autoclave fabricated from stainless steel. The autoclave has a total volume of 750 mL. To conduct the WAO tests, 200 mL of the mixed liquor from the activated sludge system with PAC was initially added to the autoclave. The autoclave, charged with compressed air, placed in a heater/shaker mechanism, heated to 220° C., and held at temperature for one hour. Following oxidation, the autoclave was cooled to room temperature and the off-gases were vented and analyzed to ensure that residual oxygen was present. The sample was removed from the autoclave and submitted for analysis.

TABLE VI

WAO of Mixed Liquor Activated Sludge System With PAC

| Parameter | Inlet Concentration | Outlet Concentration |
|---|---|---|
| Bis phenol A | <1 | <1 |
| Estradiol | <1 | <1 |
| Ethynyl estradiol | <1 | <1 |
| Estrone | <1 | <1 |

The inlet concentration results in Table VI (ng/L) indicate that there was not a reportable concentration of EDCs on the solids portion of the activated sludge with PAC mixed liquor. The EDCs were likely broken down biologically in the process, and inextricably adsorbed by the PAC. However, oxidation results (outlet concentration) demonstrated that no EDCs of the type tested were formed during the WAO process.

Use of ordinal terms such as "first," "second," "third," and the like in the specification and claims to modify an element does not by itself connote any priority, precedence, or order of one element over another or the temporal order in which acts of a method are performed, but are used merely as labels to distinguish one element having a certain name from another element having a same name (but for use of the ordinal term) to distinguish the elements.

Having thus described several aspects of at least one embodiment of this lo invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A wastewater treatment system comprising:
   a source of wastewater comprising a concentration of an endocrine disrupting compound;
   a bioreactor fluidly connected downstream of the source of wastewater, the bioreactor comprising an adsorbent; and
   an adsorbent regeneration unit fluidly connected downstream of the bioreactor.

2. The wastewater treatment system of claim 1, wherein the adsorbent regeneration unit comprises an outlet fluidly connected to the bioreactor.

3. The wastewater treatment system of claim 2, wherein the adsorbent regeneration unit includes means for intermittently allowing sludge formed in the bioreactor to be introduced into the adsorbent regeneration unit.

4. The wastewater treatment system of claim 2, wherein the adsorbent regeneration unit comprises a wet air oxidation unit.

5. The wastewater treatment system of claim 2, wherein the adsorbent regeneration unit comprises a second bioreactor.

6. The wastewater treatment system of claim 5, wherein the bioreactor comprises a first biological population and the second bioreactor comprises a second biological population.

7. The wastewater treatment system of claim 1, wherein the adsorbent is powdered activated carbon.

8. The wastewater treatment system of claim 1, further comprising a separator fluidly connected downstream of the bioreactor and fluidly connected upstream of the adsorbent regeneration unit.

9. The wastewater treatment system of claim 8, wherein the separator is a hydrocyclone.

10. The wastewater treatment system of claim 8, wherein the separator is a membrane bioreactor.

11. The wastewater treatment system of claim 10, further comprising a wet air oxidation unit fluidly connected downstream of membrane bioreactor.

12. A wastewater treatment system comprising:
a source of wastewater;
a first membrane bioreactor fluidly connected to the source of wastewater, the bioreactor comprising an adsorbent; and
a wet air oxidation unit fluidly connected to the bioreactor.

13. The wastewater treatment system of claim 12, wherein the adsorbent is activated carbon.

14. The wastewater treatment system of claim 12, further comprising a second bioreactor fluidly connected downstream of the first membrane bioreactor and upstream of the wet air oxidation unit.

15. The wastewater treatment system of claim 12, further comprising a separator fluidly connected downstream of the first membrane bioreactor and upstream of the wet air oxidation unit.

16. The wastewater treatment system of claim 15, wherein the separator is a hydrocyclone.

17. The wastewater treatment system of claim 14, wherein the second bioreactor comprises a second membrane bioreactor.

18. The wastewater treatment system of claim 17, further comprising a hydrocyclone fluidly connected downstream of the first membrane bioreactor and upstream of the second membrane bioreactor.

19. The wastewater treatment system of claim 18, further comprising a second wet air oxidation unit fluidly connected downstream of the hydrocyclone and upstream of the second membrane bioreactor.

20. The wastewater treatment system of claim 18, further comprising a recirculation line fluidly connected to the wet air oxidation unit and the first membrane bioreactor.

21. The wastewater treatment system of claim 12, further comprising a second bioreactor fluidly connected to the inlet of the first membrane bioreactor.

22. The wastewater treatment system of claim 21, wherein the second bioreactor further comprises activated carbon.

23. The wastewater treatment system of claim 22, further comprising a hydrocyclone fluidly connected to an outlet of the second bioreactor and an inlet to the membrane bioreactor.

24. The wastewater treatment system of claim 23, further comprising a recirculation line fluidly connected to the hydrocyclone and the second bioreactor, the recirculation line comprising a wet air oxidation unit.

25. The wastewater treatment system of claim 12, further comprising a controller configured to fluidly direct a product stream comprising the adsorbent from the first membrane bioreactor to the wet air oxidation unit.

26. A wastewater treatment system comprising:
a source of wastewater;
a first bioreactor fluidly connected to the source of wastewater, the first bioreactor comprising an adsorbent;
a second bioreactor fluidly connected downstream of the first bioreactor; and
a separator fluidly connected downstream of the first bioreactor and upstream of the second bioreactor.

27. The wastewater treatment system of claim 26, further comprising:
a first biological population disposed in the first bioreactor; and
a second biological population disposed in the second bioreactor.

28. The wastewater treatment system of claim 26, wherein the means for removing inert solids comprises a separator.

29. The wastewater treatment system of claim 28, wherein the separator is a clarifier.

30. The wastewater treatment system of claim 28, wherein the separator is a hydrocyclone.

31. A wastewater treatment system comprising:
a source of wastewater;
a wet air oxidation unit comprising an inlet fluidly connected to the source of wastewater and an outlet; and
a membrane bioreactor comprising a biological population and fluidly connected to the outlet.

32. The waste water treatment system of claim 31, wherein the membrane bioreactor further comprises activated carbon.

33. A wastewater treatment system comprising:
a source of wastewater;
a bioreactor fluidly connected downstream of the source of wastewater, the bioreactor comprising an adsorbent; and
an adsorbent regeneration unit fluidly connected downstream of the bioreactor, wherein the adsorbent regeneration unit comprises a second bioreactor.

34. The wastewater treatment system of claim 33, wherein the bioreactor comprises a first biological population and the second bioreactor comprises a second biological population.

35. A wastewater treatment system comprising:
a source of wastewater;
a bioreactor fluidly connected downstream of the source of wastewater, the bioreactor comprising an adsorbent;
an adsorbent regeneration unit fluidly connected downstream of the bioreactor and
a separator selected from the group consisting of a hydrocyclone and a membrane bioreactor fluidly connected downstream of the bioreactor and fluidly connected upstream of the adsorbent regeneration unit.

36. The wastewater treatment system of claim 34, wherein the adsorbent regeneration unit comprises a wet air oxidation unit.

37. The wastewater treatment system of claim 4, further comprising:
a controller configured to fluidly direct a product stream comprising the adsorbent from the bioreactor to the wet air oxidation unit.

* * * * *